United States Patent
Dastidar et al.

(10) Patent No.: US 7,212,032 B1
(45) Date of Patent: May 1, 2007

(54) METHOD AND APPARATUS FOR MONITORING YIELD OF INTEGRATED CIRCUITS

(75) Inventors: Jayabrata Ghosh Dastidar, San Jose, CA (US); Laiq Chughtai, San Jose, CA (US); William Y. Hata, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/411,310

(22) Filed: Apr. 25, 2006

(51) Int. Cl.
*H03K 19/173* (2006.01)
(52) U.S. Cl. .......................................... 326/38; 326/10
(58) Field of Classification Search ................. 326/38, 326/10, 16; 714/738; 716/4, 5, 517; 257/48, 257/758
See application file for complete search history.

(56) References Cited

U.S. PATENT DOCUMENTS 5,512,397 A * 4/1996 Leedy .......................... 430/30
6,222,382 B1 * 4/2001 Jefferson et al. .............. 326/38
2004/0010741 A1 * 1/2004 Forlenza et al. ............ 714/738

* cited by examiner

*Primary Examiner*—Rexford Barnie
*Assistant Examiner*—Joseph Lauture
(74) *Attorney, Agent, or Firm*—Martine Penilla & Gencarella, LLP

(57) ABSTRACT

A method for analyzing a structured integrated circuit is provided. The method includes identifying a random logic region of the structured integrated circuit. The structured integrated circuit includes a predefined layout for transistors and basic interconnections to define a set of logic elements. A tile array of basic logic cells is integrated throughout the identified random logic region. The tile array of basic logic cells is defined from the set of logic elements of the structured integrated circuit. The tile array of basic cells enables communication of testing signals along the tile array of basic logic cells in a first and a second direction. The first and second directions are different from one another. The testing signals help to identify one or more errors in the tile array of basic logic cells. The array format assists in diagnosing and curing defects in the tile array of basic logic cells. The errors are pinpointed to a basic logic cell at the intersection of the first and second direction.

18 Claims, 8 Drawing Sheets

METHOD AND APPARATUS FOR MONITORING YIELD OF INTEGRATED CIRCUITS

BACKGROUND

This application relates to integrated circuits, and more particularly, to methods in which to diagnose and rectify yield issues when a new design is introduced on a new process.

Structured application specific integrated circuits (ASIC) are integrated circuit devices that include predefined layers, a large portion of which can be configured to implement random logic. Random logic can be characterized as a sea of combinatorial logic and sequential elements. The random logic can be efficiently integrated into a customer design by combining the different unit logic elements within the random logic. Defects in the structured ASIC can occur anywhere. In case of the predefined layers, the defects can occur in the random logic section or in other sections. To diagnose and cure defects in the random logic section can be harder than to diagnose and cure defects in other portions of the structured ASIC. For example, defects are easier to diagnose in memory blocks due to their regularity.

Currently, integrated circuits (ICs) are tested using automatic test pattern generator (ATPG) programs. ATPG programs generate test vectors, which are driven through a test scheme known as a scan design. Scan designs move test vectors in a serial manner. The test vectors are initially captured in scan chains and then forwarded through the logic to be tested and the test results are captured in registers. Scan chains are generally defined by numerous shift registers. As this type of testing depends on the test vector, the type of defect, and other variables, this type of testing is not very effective in pinpointing defects in the case of random logic.

As a result, there is a need to be able to diagnose and rectify defects in random logic rapidly.

SUMMARY

Broadly speaking, the present invention fills these needs by providing a method and apparatus for monitoring yield of ICs. The embodiments described herein integrate a yield tile array throughout the random logic portion of a structure ASIC. The logic elements that form the yield tile array are selected in such a way that the yield tile array is representative of the different customer design layouts.

In one aspect of the invention, a computer implemented method for inspecting a structured integrated circuit, is provided. The method includes identifying a random logic region of the structured integrated circuit. The structured integrated circuit includes a predefined layout for transistors and basic interconnections to define a set of logic elements. A tile array of basic logic cells is integrated throughout the identified random logic region. The tile array of basic logic cells is defined from the set of logic elements of the structured integrated circuit. The tile array of basic cells enables communication of test signals along the tile array of basic logic cells in a first and a second direction. The first and second directions are perpendicular to each other. In one embodiment, the directions are substantially intersecting with each other, even if not exactly perpendicular. The test signals help to identify one or more errors in the tile array of basic logic cells. The array format assists in diagnosing and curing defects in the tile array of basic logic cells. The errors may be pinpointed to a basic logic cell at the intersection of the first and second direction.

In another aspect of the invention, a semiconductor device is provided. The semiconductor device includes a substrate. The semiconductor device further includes a predetermined transistor layout, which is formed throughout the random logic portion of the substrate. A predetermined interconnection layer is used for connecting to the predetermined transistor layout. The predetermined interconnection layer forms a set of logic elements and the set of logic elements is capable of being interconnected on subsequent layers to define a specific logic design. A plurality of structured yield tiles are configured in a row and column array over the random logic portion of the substrate. The plurality of structured yield tiles utilize the logic elements from the set of logic elements. A variety of logic elements, from the set of logic elements, are utilized by the structured yield tiles, in order to provide maximum exposure to the different processes that may be used. The individual structured yield tiles can be accessed by passing data along the rows and columns of the structured yield tiles. Moreover, errors can be identified at the specific intersections of the rows and columns of the row and column array. The errors can be isolated to one of the structured yield tiles located at the intersection of the row and column array. The structured yield tiles are configured in a row and column format allowing easy diagnosis and curing of the defects.

In another aspect of the invention, a method for analyzing a structured integrated circuit, is provided. The method includes identifying a random logic region of the structured integrated circuit. The structured integrated circuit includes a predefined layout for transistors and basic interconnections to define a set of logic elements. A tile array of basic logic cells is integrated throughout the identified random logic region. The tile array of basic logic cells is defined from the set of logic elements of the structured integrated circuit. The tile array of basic cells enables communication of test signals along the tile array of basic logic cells in at least a first and a second direction. The first and second directions are different from each other. For example, the first and second direction may be perpendicular to one another. The test signals help to identify one or more errors in the tile array of basic logic cells. The array format assists in diagnosing and curing defects in the tile array of basic logic cells. The errors may be pinpointed to a basic logic cell at the intersection of the first and second direction.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for an apparatus and method for diagnosing and rectifying defects in random logic. It will be obvious, however, to one skilled in the art, that the present invention may be practiced without some or all of these specific details. In other instances, well known process operations have not been described in detail in order not to unnecessarily obscure the present invention.

The embodiments illustrated herein describe a method and apparatus for rapidly diagnosing manufacturing defects in random logic that helps in rectifying the root cause of these defects. The embodiments described herein utilize a structured yield tile for easy diagnosis of the defects that may have caused the flaws in the process or in the basic design building blocks such as library elements. The yield tile is created on a structured ASIC platform to diagnose the process and design flaws of the structured ASIC upfront, prior to using the process to make chips using customer designs. In one embodiment, the yield tile is formed as a matrix structure, rather than a serial structure, for easy diagnosis of the defect across an area and to provide accurate localization information to help isolate the root cause of the defect so that the defect can be avoided, by making appropriate adjustments to the layout or process before proceeding to the manufacture of a customer design.

Figure 1:
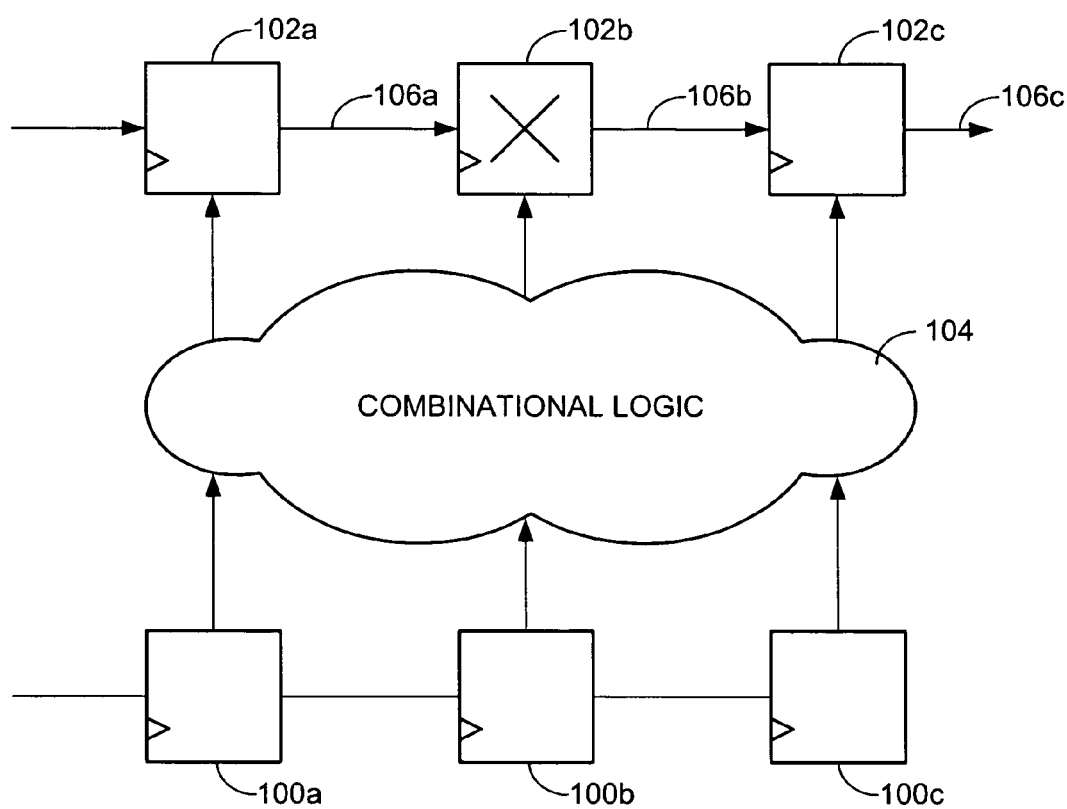
FIG. 1 illustrates a scan design testing scheme.

FIG. 1 illustrates a scan design testing scheme. FIG. 1 includes shift registers 100a–100c, and 102a–102c, and combinational logic 104. The test vectors are loaded into the shift registers 100a–100c. The test vectors are loaded in a serial manner. Once all the data bits for the test vectors are in place, the test vectors are driven through the combinational logic 104, and the result is registered in shift registers 102a–102c. The data are shifted through registers 102–102c, as indicated by arrows 106a–106c, and the outputs are compared with the expected result. If the output of the shift registers 102a–102c does not match the expected result, then that indicates a failure. One skilled in the art should understand that FIG. 1 is exemplary and an actual design will have many more shift registers in them. In such case, if one of the shift registers indicates a wrong result, it would be hard to pinpoint the shift register associated with the wrong result. Moreover, even when the defect is narrowed down to one of the shift registers, it will be difficult to uniquely localize the defect in the combinational logic 104.

Figure 2:
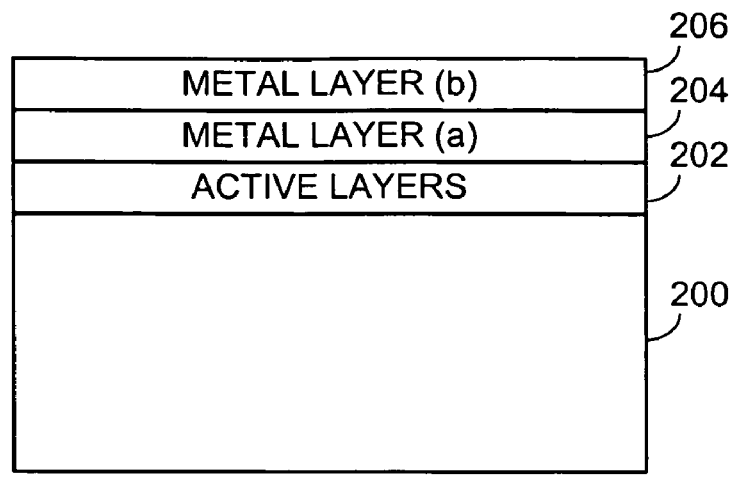
FIG. 2 shows a cross sectional side view of a structured ASIC, in accordance with an embodiment of the present invention.

FIG. 2 shows a cross sectional side view of structured ASIC, in accordance with an embodiment of the present invention. The side view as shown includes a substrate 200, active layers 202, and metal layers 204 and 206. The active layers 202 and some portions of the metal layer 204 are predefined. In one embodiment, predefined implies that the source and drain are defined so that the placement of the gates are predetermined in accordance with some geometric layout. In this embodiment, "cells" can be defined on the active layers 202, metal layers 204 and 206. A cell may include a number of logic elements, which are made of unit elements, such as transistors. Some of the exemplary logic elements are inverters, AND gates, NAND gates, OR gates, NOR gates, flip-flops, registers, etc. By connecting cells in the appropriate manner, the desired functionality can be achieved. Metal layer 206 (and possibly other upper metal layers) includes routing connections and vias (not shown), which are configurable by the customer. For example, the vias in the metal layer 206 may be used to route the different cells. The customer design may be integrated into the metal layer 206 so that the correct vias and interconnects are used to route the cells in the active layer 202 to achieve a desired functionality.

In order to test the structured ASIC, instead of the customer design being used to configure the structured ASIC, a design logic that provides maximum exposure to all the process steps is used. The design logic that is used for testing the structured ASIC includes a large number of the logic elements. A yield tile incorporates a sampling of the type of logic elements that would ultimately be used in a customer design. A plurality of yield tiles are arranged to cover a large area of the random logic portion of a chip so that the yield tile best covers the random logic section. Therefore, yield tile is defined by a plurality of cells, which are formed from the basic set of logic elements defined by the structured ASIC. However, it is envisioned that the yield tile will encompass as many combinations of logic elements as would be used in an actual customer design, once the customer design is formed over the structured ASIC.

The defects in the structured ASIC is a function of the process and the design. In one embodiment, the design is the various layout structures. The yield of the structured ASIC is a function of the defects. The more defects the lesser the yield. Therefore, when the defect is to be remedied, either the process or the design or both have to be corrected. As such, the yield tile in the embodiments described herein is generated in such a way that the yield tile will have exposure to a variety of process steps and is a good subset of the design layout. For example, if the design layout of the yield tile only included a group of inverters, then using the yield tile may not diagnose certain corner cases.

Figure 3:
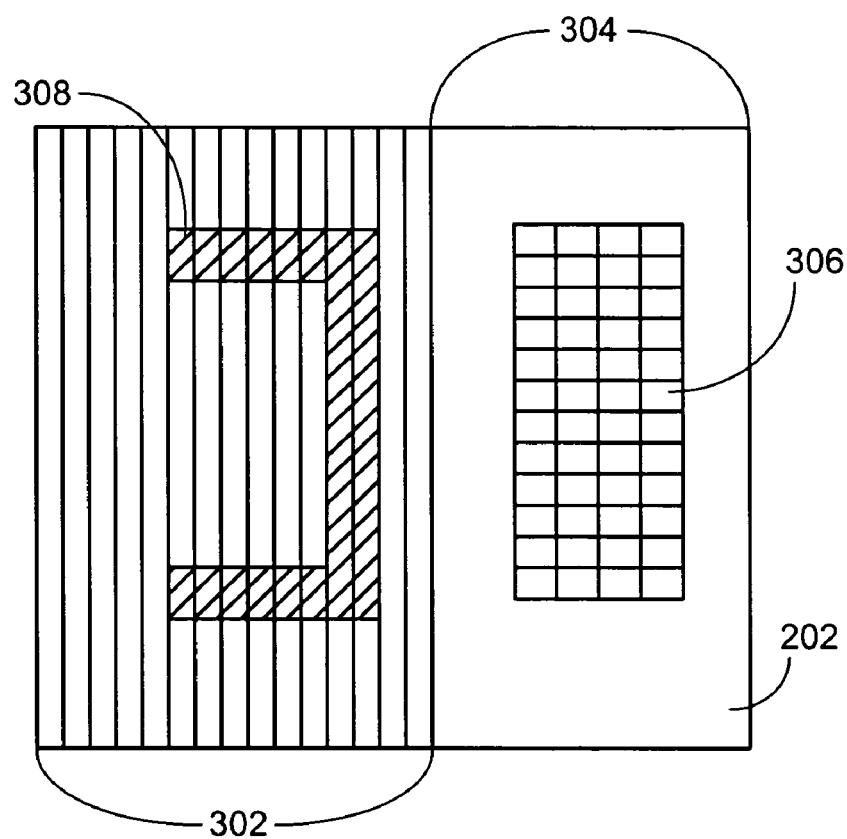
FIG. 3 shows a schematic top view of an active layer, in accordance with an embodiment of the present invention.

FIG. 3 shows a schematic top view of the active layer 202, in accordance with an embodiment of the present invention. The active layer 202 includes a random logic portion 302, and a predefined portion 304. The customer may only use a fraction of the area of the random logic portion 302 to achieve the desired functionality. As a simplistic example, portion 308 is designated as the exemplary section used by the customer. In the predefined portion 304, portion 306 can be a memory, multiplier, etc. Portion 304 is very structured, and thus, does not suffer in the ability to pinpoint where an error is occurring. However, in random logic portion 302, as mentioned above, it is difficult to identify where in the sea of logic an error may have occurred.

Figure 4:
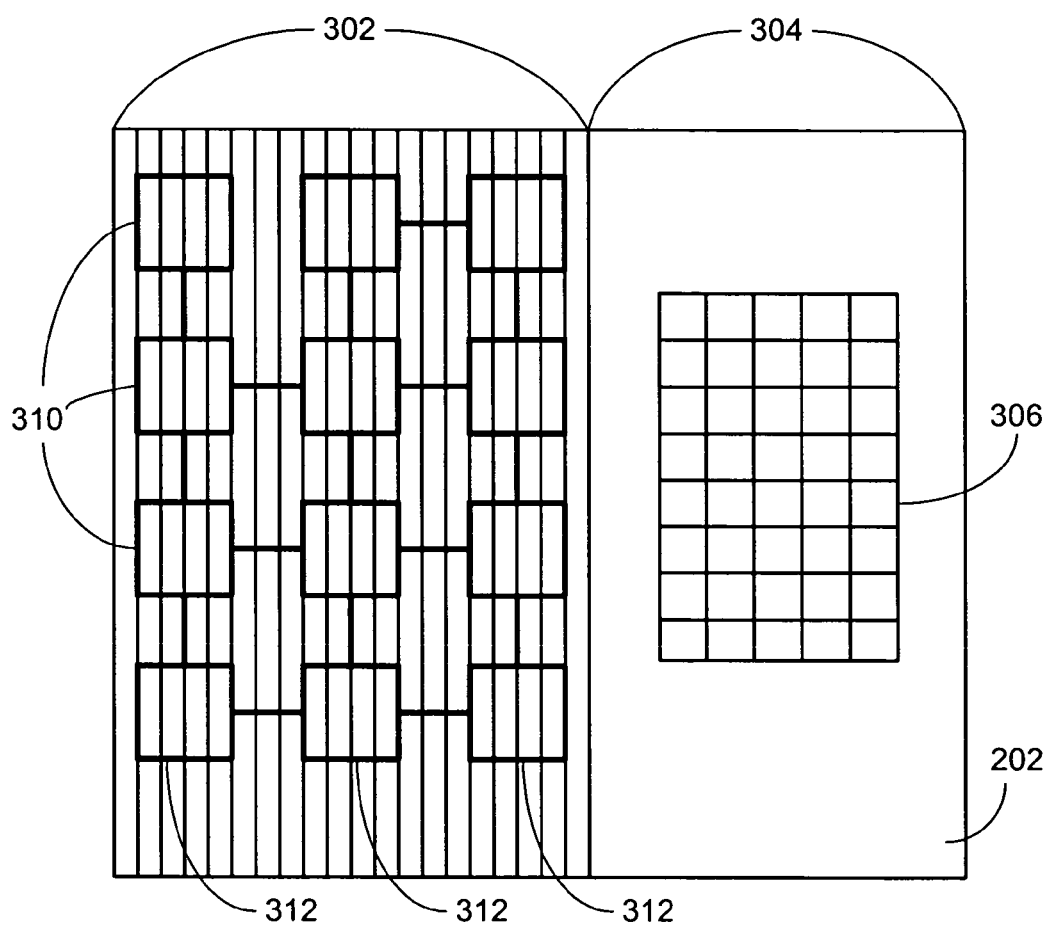
FIG. 4 shows the schematic top view of the active layer, with the yield tile array integrated throughout the random logic portion, in accordance with an embodiment of the present invention.

FIG. 4 shows the schematic top view of the active layer 202 with the yield tile array integrated throughout the random logic portion, in accordance with an embodiment of the present invention. As described above, the active layer 202 includes a random logic portion 302 and a predefined portion 304. The yield tile array 310 is integrated in such a way that the yield tile array 310 covers a large percentage area of the random logic portion 302. Further, yield tile array 310 is created in a grid structure so that it will be easy to determine the point of failure. Thus, before the actual customer design is made, the structured ASIC can be tested for defects using yield tile array 310. Yield tile array 310 is created in such a way that the yield tile array 310 covers as large a percentage of the random logic area on the die as possible so that yield tile array 310 is likely to cover the majority of the area that different customers are likely to use. Since each customer is likely to have a different flow, by having the yield tile array 310 cover the maximum area of the random logic portion 302 on the die, the likelihood of yield tile array 310 being exposed to defects encountered by the different types of customer flow will be high. In one embodiment, the individual tile 312 within the yield tile array 310 is one of a register or a memory cell. It should be understood that the entire yield tile array need not be made of the same type of tile. The tiles in the different rows and the different columns, or in the same rows and the same columns of the yield tile array can be of different types. For example, one row may be of registers while another row may be of memories. Of course, in one embodiment, all of the tiles in the array can be identical.

Figure 5:
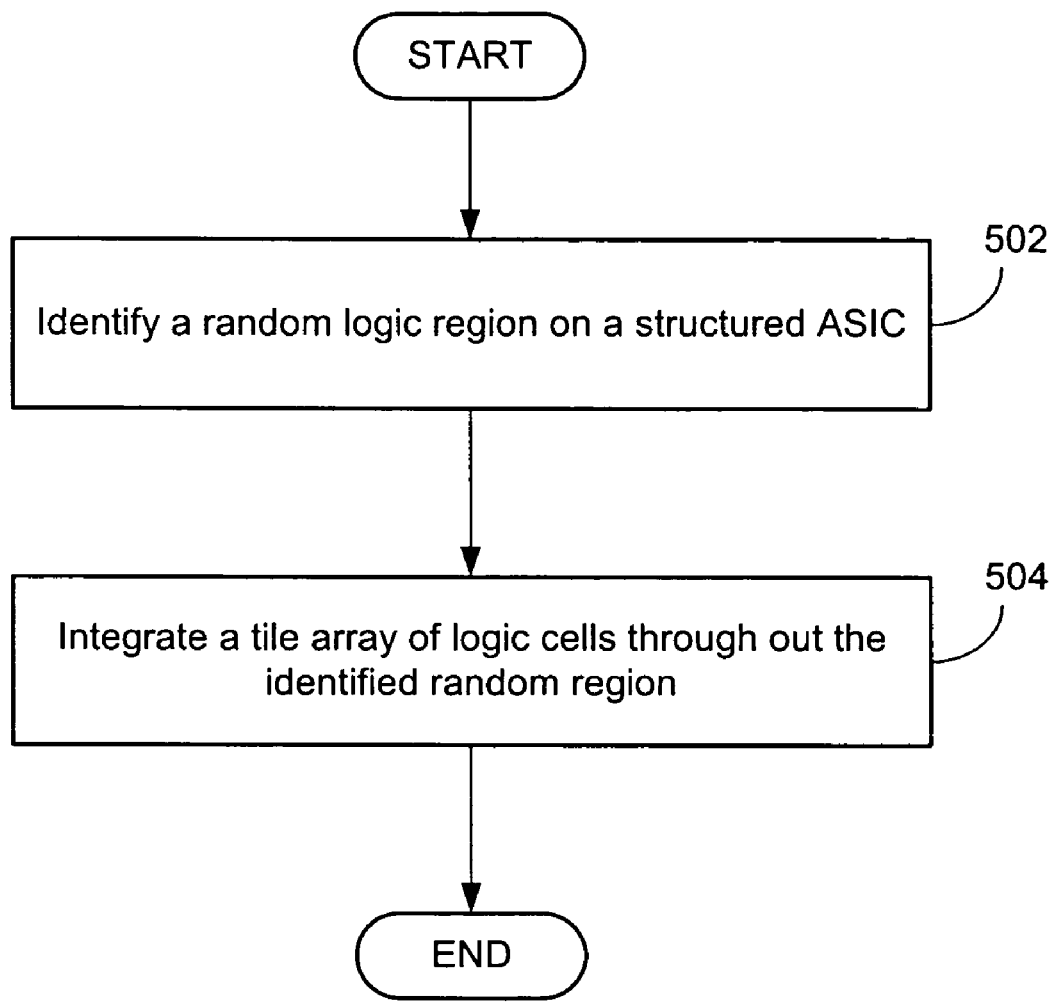
FIG. 5 is a flow chart illustrating the method of operations involved in inspecting a structured ASIC, in accordance with an embodiment of the present invention.

FIG. 5 is a flow chart illustrating the method of operations involved in inspecting a structured ASIC, in accordance with an embodiment of the present invention. The method begins with operation 502, where a random logic region on a structured ASIC is identified. As described above, the structured ASIC has a random logic region and a predefined region in the active layer. A tile array of basic logic cells is integrated into the identified random logic region in operation 504. The integration is made by processing a wafer (having chips that integrate the tile array) through numerous process operations needed for the manufacturer of a chip. The structured ASIC having the tile array is tested for defects by sending a signal in a first and a second direction through the tile array of basic logic cells. The second direction is perpendicular to or intersects with the first direction so that any error in signal transmission can be narrowed down to a basic logic cell located at the intersection of the first direction and the second direction. The method of operations described above can be fully or substantially automated using computing technology.

Figure 6:
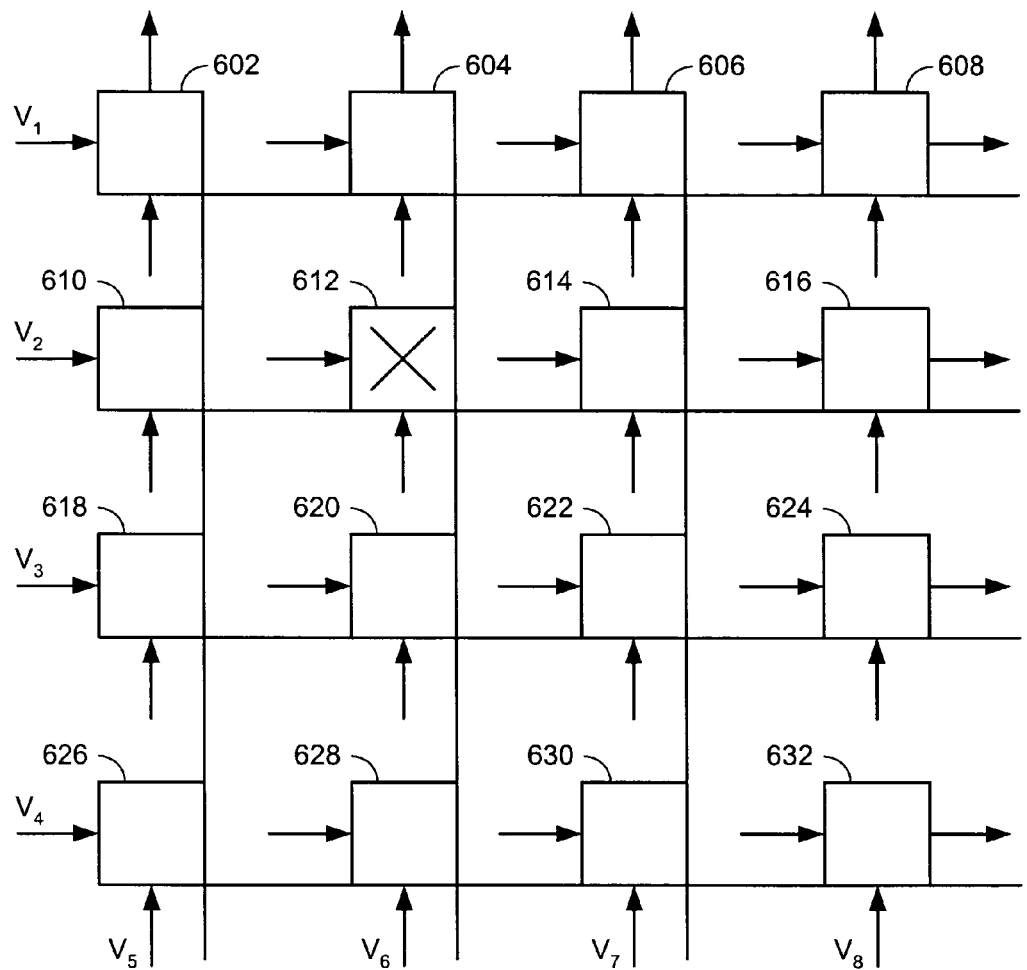
FIG. 6 shows the tile array in detail, in accordance with an embodiment of the present invention.

FIG. 6 shows the tile array in detail, in accordance with an embodiment of the present invention. FIG. 6 further illustrates the method operations described with respect to FIG. 5. The tile array includes basic logic cells 602–632. Signals $V_1$–$V_4$ are sent through basic logic cells 602–632 in the horizontal direction. Similarly, signals V5–V8 are sent though basic logic cells 602–632 in the vertical direction. If the signal propagation through one of the basic logic cells 602–632 fails, then the cell that caused the failure can be easily determined. For example, if the signal propagation fails due to a defect in basic logic cell 612, then the failure can be easily pinpointed. In this example, if the signal V6 does not come out as expected due to the defect in basic logic cell 612, then during the testing of signals $V_1$–$V_4$ horizontally, $V_2$ is likely to come out wrong. The basic logic cell that is at the intersection of signals $V_6$ and $V_2$ is basic logic cell 612. Thus, the defect can be narrowed down to the defective basic logic cell 612. In one embodiment, the defect is decoded down to the basic logic cell 612, algorithmically. As can be seen, using a combination of a scan scheme with a matrix structure for the tile array provides for easy diagnosis of defects in structured ASICs. When several failures are detected due to defects in various cells, then a more custom analysis may be conducted using a parallel shift method is used to identify the different defective cells. In one embodiment, instead of using horizontal or vertical shifts exclusively, a combination of a sequence of horizontal and vertical shifts are used. For example, in case of an N×M array, a subset of N horizontal shifts followed by a subset of M vertical shifts are used to reach the outputs.

Figure 7:
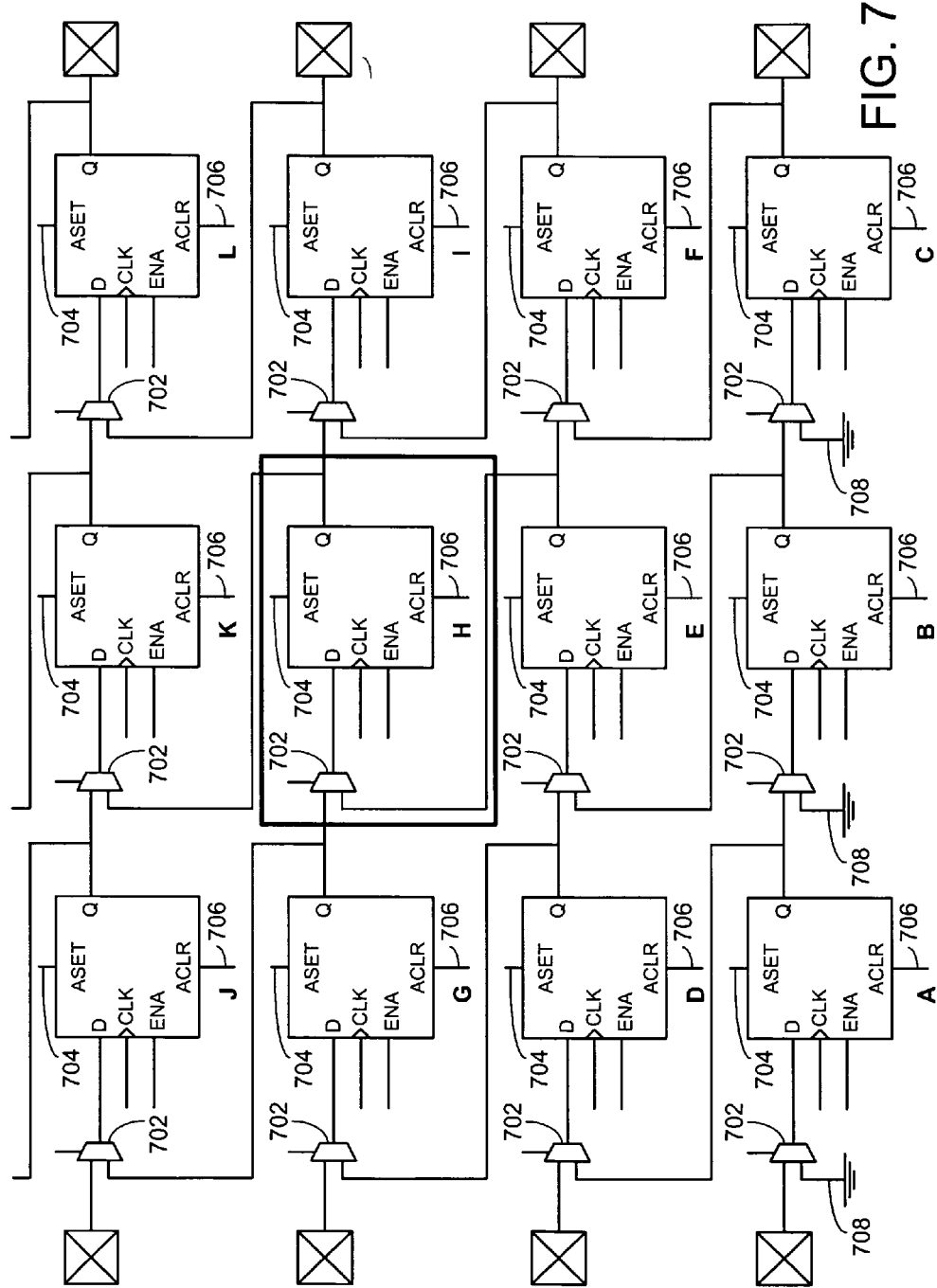
FIG. 7 shows an exemplary tile array, in accordance with an embodiment of the present invention.

FIG. 7 shows an exemplary tile array, in accordance with an embodiment of the present invention. The tile array includes registers A–L. Registers A–L are fed by two input multiplexers 702. One skilled in the art should understand that cells are not limited to registers, but the cells can also be memories. In this example, the registers A–L are shown to be shift registers. The output of the each of the registers A–L is fed to the input multiplexer (mux) 702 of the next register both horizontally and vertically. The registers A–L further include ASET and ACLR ports 704 and 706, respectively. When testing, the data can be sent horizontally through registers, ABC, DEF, GHI, and JKL. Similarly, data can be sent vertically through registers ADGJ, BEHK, and CFIL. When a problem arises, the problem can be pinpointed to a particular register in the tile array. For example, in FIG. 7, register H is indicated as having a problem. When the data are sent vertically through registers BEHK, there will be an unexpected output from register K. Similarly, when the data are sent horizontally through registers GHI, there would be an unexpected result from register I. From this, the defect can be narrowed down to the intersection of registers GHI and BEHK, which is register H. Accordingly, the design or the process parameters may be modified to prevent the defect from occurring. For example, a contamination in the process chamber may be the cause for a certain batch of structured ASICs to have a particular defect. Once the defect is pinpointed to a certain area on the structured ASIC, the process conditions in the chamber during the manufacturing of that particular section of the structured ASIC may be modified to avoid that defect.

Figure 8:
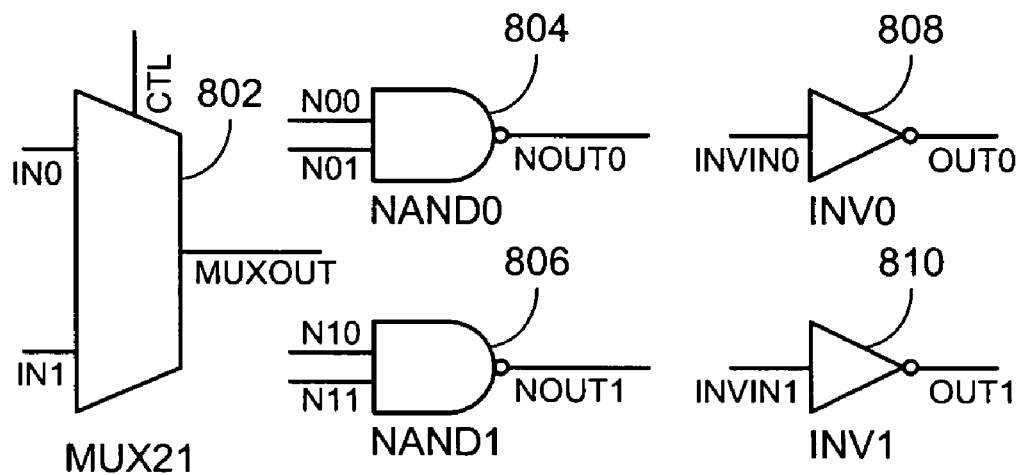
FIG. 8 shows the exemplary logic elements to be included in a tile in the tile array, in accordance with the present invention.
Figure 9:
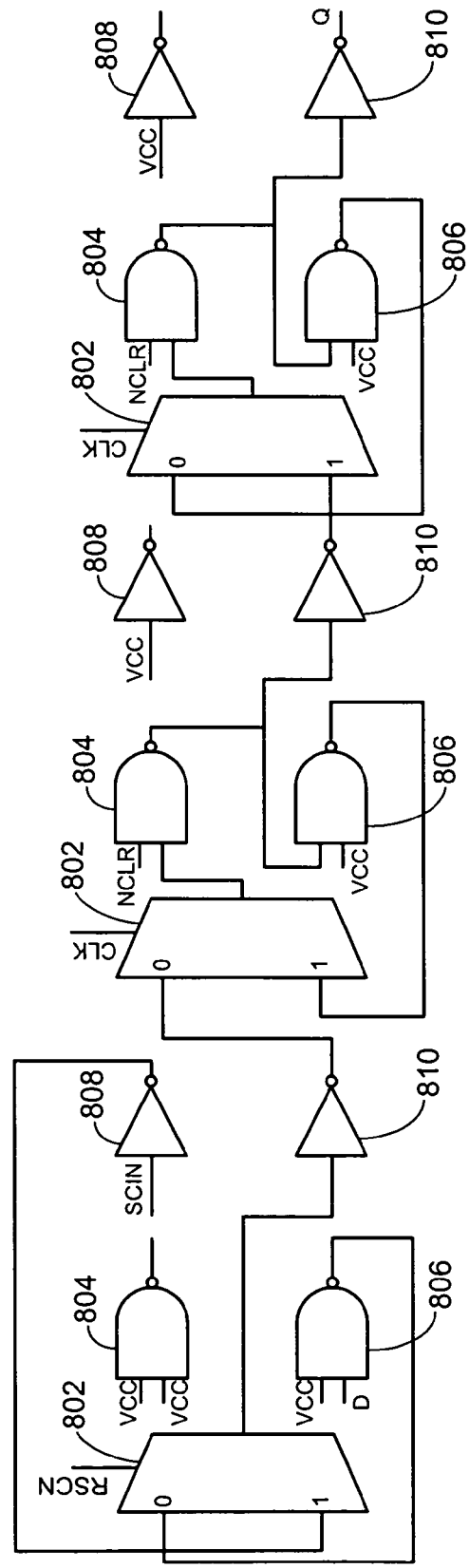
FIG. 9 shows an exemplary register structure using the logic elements, in accordance with an embodiment of the present invention.

FIG. 8 shows the exemplary logic elements to be included in a cell in the tile array, in accordance with the present invention. The cell is shown to include multiplexer 802, NAND gates 804 and 806 and inverters 808 and 810. A tile may include one or more cells. Therefore, the tile includes several different types of logic elements so that the tile will provide maximum exposure to the various process parameters. One skilled in the art should understand that the logic elements shown are exemplary, and other types of logic elements such as AND gates, OR gates, etc. may be included in the tile. FIG. 9 shows an exemplary register structure made of different cells described above with respect to FIG. 8, in accordance with an embodiment of the present invention. One skilled in the art should understand that the register structure shown in FIG. 9 is exemplary and is not meant to be limiting. As described above, each tile in the tile array may include one or more registers such as the one shown in FIG. 9. In one embodiment, the registers within the tile are fed through a multiplexer (not shown).

The structured ASIC described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A computer implemented method for inspecting a structured integrated circuit, comprising:
   identifying a random logic region of the structured integrated circuit, the structured integrated circuit having a predefined layout for transistors and basic interconnections to define a set of logic elements; and
   integrating a tile array of basic logic cells throughout the identified random logic region, each basic logic cell of the array of basic logic cells being defined from a set of logic elements of the structured integrated circuit, the tile array of basic logic cells enabling communication of testing signals in a first direction along the tile array of basic logic cells and in a second direction along the tile array of basic logic cells,
   wherein the first direction intersects with the second direction and the testing signals assist in identifying one or more errors in the tile array of basic logic cells.

2. A computer implemented method for inspecting a structured integrated circuit as recited in claim 1, wherein the one or more errors occur at one or more intersections of the tile array of basic logic cells defined in the first direction and second direction.

3. A computer implemented method for inspecting a structured integrated circuit as recited in claim 1, wherein the integrating of the tile array of basic logic cells throughout the identified random logic region is in a row and column format.

4. A computer implemented method for inspecting a structured integrated circuit as recited in claim 1, wherein an error of the one or more errors identifies a potential yield impacting defect.

5. A computer implemented method for inspecting a structured integrated circuit as recited in claim 1, wherein the identified one or more errors in the tile array of basic logic cells are analyzed to identify either one or both of a process parameter and a design parameter causing the one or more errors in the tile array of basic logic cells.

6. A computer implemented method for inspecting a structured integrated circuit as recited in claim 5, further comprising:
   adjusting either one or both of the process parameter and the design parameter in the structured integrated circuit having the predefined layout for transistors and basic interconnections that define the set of logic elements, the adjusting being done to reduce the errors and thus reduce yield defects.

7. A computer implemented method for inspecting a structured integrated circuit as recited in claim 1, further comprising,
   if more than one intersection in the tile array of basic logic cells define an error, implementing a parallel shift algorithm to identify which specific ones of the tile array of basic logic cells has an error.

8. A computer implemented method for inspecting a structured integrated circuit as recited in claim 7, wherein the specific ones of the tile array of basic logic cells having the error assist in localizing a specific area region in the structured integrated circuit exhibiting the error.

9. A semiconductor device, comprising:
   a substrate;
   a predetermined transistor layout formed throughout a random logic portion of the substrate;
   a predetermined interconnection layer for connecting to the predetermined transistor layout, the predetermined interconnection layer forming a set of logic elements, the set of logic elements capable of being interconnected on subsequent layers to define a specific logic design;
   a plurality of structured yield tiles configured in a row and column array over the random logic portion of the substrate, the plurality of structured yield tiles utilizing logic elements of the set of logic elements, wherein each of the plurality of structured yield tiles is capable of being accessed by data passed along the rows and along the columns and errors are capable of being identified at specific intersections of the rows and columns of the row and column array, and the specific intersections contain one of the structured yield tiles.

10. A semiconductor device of claim 9 wherein the yield tiles at the specific intersection are analyzed to determine a cause of the error.

11. A semiconductor device of claim 9 wherein the error influences a yield of the semiconductor device.

12. A semiconductor device of claim 11, wherein the error is a function of a process parameter or a design parameter.

13. A semiconductor device of claim 12, wherein the process parameter or the design parameter is adjusted to increase the yield.

14. A semiconductor device of claim 12, wherein the structured yield tiles cover a large area of the random logic portion of the substrate.

15. A semiconductor device of the claim 12, wherein the specific logic design includes a large number of logic elements of the set of logic elements to provide a maximum exposure to the process parameter.

16. A semiconductor device of the claim 12, wherein the specific logic design includes a large of number logic elements to increase the possibility of including logic elements to be used by different flows.

17. A method for analyzing a structured integrated circuit, comprising:
   identifying a random logic region of the structured integrated circuit, the structured integrated circuit having a predefined layout for transistors and basic interconnections to define a set of logic elements; and
   integrating a tile array of basic logic cells throughout the identified random logic region, each basic logic cell of the array of basic logic cells being defined from a set of logic elements of the structured integrated circuit, the tile array of basic cells enabling communication of testing signals in a first direction along the tile array of basic logic cells and in a second direction along the tile array of basic logic cells,
   wherein the first direction is different from the second direction and the testing signals assist in identifying one or more errors in the tile array of basic logic cells.

18. A method of claim 17, wherein the first direction is perpendicular to the second direction.

* * * * *